United States Patent [19]
Yamada et al.

[11] 4,060,772
[45] Nov. 29, 1977

[54] OSCILLATOR

[75] Inventors: Hisashi Yamada, Oiso; Yoshinori Horiko, Yokohama, both of Japan

[73] Assignee: Tokyo Shibaura Electric Co., Ltd., Tokyo, Japan

[21] Appl. No.: 654,852

[22] Filed: Feb. 3, 1976

[30] Foreign Application Priority Data

Feb. 6, 1975 Japan .................................. 50-14907

[51] Int. Cl.² .............................................. H03B 5/36
[52] U.S. Cl. ............................. 331/116 R; 331/117 R
[58] Field of Search ....................... 58/23 R, 23 AC; 331/116 R, 108 C, 108 D, 110, 117 R, 159

[56] References Cited

U.S. PATENT DOCUMENTS 3,714,867   2/1973   Dargent .............................. 58/23 A
3,965,442   6/1976   Eaton, Jr. ........................... 331/116 R Primary Examiner—John Kominski
Attorney, Agent, or Firm—Finnegan, Henderson, Farabow & Garrett

[57] ABSTRACT

An oscillator having a phase-inverting oscillation inverter formed of insulated gate field effect transistors, a feedback circuit for inverting the phase of an output signal from the phase-inverting oscillation inverter and feeding the phase-inverted output signal back to the input side of the phase-inverting oscillation inverter and an amplifier for amplifying an output signal from the phase-inverting oscillation inverter. Said feedback circuit is formed of a passive circuit and has a larger voltage gain than 1. The signal fed back by the feedback circuit is drawn out from the input side of the oscillation inverter and delivered to the succeeding amplifier.

13 Claims, 11 Drawing Figures

OSCILLATOR

This invention relates to an oscillator using an insulated gate field effect transistor.

Actuation of a logical arithmetic operation circuit, for example, an electronic computer generally requires a clock pulse oscillator. The clock pulse is demanded to have an amplitude required for a logical arithmetic operation circuit connected to the oscillator, namely, an amplitude capable of reliably crossing both logical levels of "1" and "0" prescribed for actuation of a logical arithmetic operation circuit.

FIG. 1 illustrates an example of such oscillator of the prior art. There will now be described the arrangement of the oscillator of FIG. 1. Referential number 101 denotes a phase-inverting amplifier, namely, an oscillation inverter consisting of an MOS field effect transistor 102 (hereinafter referred to as an "MOS FET") as a load and an MOS FET 103 as a driver. The drain electrode of the MOS FET 102 is connected to a D.C. source 104 having a voltage $V_{DD}$. A feedback circuit 111 consisting of a quartz crystal vibrator 108 which is a piezoelectric element and condensers 109, 110 respectively having capacitances $c_1$, $c_2$ is connected through terminal pins 106, 107 between the output terminal of the oscillation inverter 101 (represented by a junction 105 of the source and gate electrodes of the MOS FET 102 with the drain electrode of the MOS FET 103) and the gate electrode of the MOS FET 103. the capacitance $c_1$ of the condenser 109 is chosen to be smaller than the capacitance $c_2$ of the condenser 110 so as to keep the voltage gain of the feedback circuit 111 at a smaller value than 1. The drain electrode of the MOS FET 102 included in the oscillation inverter 101 and the output terminal 105 are connected to an amplification inverter 114 formed of MOS FET's 112, 113 with the same arrangement of the oscillation inverter 101. The junction 115 of the gate electrode and source electrode of the MOS FET inverter 112 with the drain electrode of the MOS FET 113 is connected to the output terminal 116 of the amplification inverter 114. A first protective circuit 119 formed of a resistor 117 and regulating diode 118 to protect the MOS FET 103 included in the oscillation inverter 101 is provided between the gate electrode of said MOS FET 103 and terminal pin 107. A second protective circuit 122 formed of a resistor 120 and regulating diode 121 to protect the MOS FET 113 of the amplification inverter 114 is provided between the gate electrode of said MOS FET 113 and terminal pin 106. A bias resistor 123 is connected between the terminal pins 106, 107.

There will now be briefly described the operation of the prior art oscillator of FIG. 1. When the oscillation inverter 101 is supplied with power from the D.C. source 104, then the MOS FET's 102, 103 are operated to produce an oscillated output at the drain electrode of the MOS FET 103, namely, the output terminal 105 of the oscillation inverter 101. Said oscillated output is carried to the feedback circuit 111 formed of the quartz crystal vibrator 108 and condensers 109, 110. The feedback circuit 111 which is a resonance circuit for inverting the phase of an output signal from that of an input signal at the time of resonance sends forth a feedback output signal whose phase is inverted from that of an oscillated output. Namely, a positive feedback is carried out.

The feedback output signal is conducted through the resistor 117 of the first protective circuit 119 to the input terminal of the oscillation inverter 101, namely, the gate electrode of the MOS FET 103. The above-mentioned operation sustains oscillation.

The output signal at the output terminal 105 of the oscillation inverter 101, namely, the drain electrode of the MOS FET 103 is delivered to the feedback circuit 111 as previously mentioned and also to the gate electrode of the MOS FET 113 of the amplification inverter 114 through the resistor 120 of the protective circuit 122. The amplification inverter 114 amplifies an oscillated output signal from the oscillation inverter 101 to generate an output signal of large amplitude at the output terminal 116 of said inverter 114. Said oscillated output signal is used to actuate a logical arithmetic operation circuit, for example, an electronic computer.

Where, with the above-mentioned oscillation circuit, the MOS FET 102 of the oscillation inverter 101 and the MOS FET 112 of the amplification inverter 114 have different threshold voltages or the MOS FET 103 of said oscillation inverter 101 and the MOS FET 113 of said amplification inverter 114 have different threshold voltages, or all said MOS FET's have different threshold voltages, then an oscillated output signal produced at the output terminal 105 of the oscillation inverter 101 does not take an accurately amplified form, but sometimes has its amplitude considerably distorted. In other words, the logical arithmetic operation circuit connected to the oscillation circuit is often supplied with a signal of insufficient amplitude, namely, a signal lacking an amplitude capable of crossing both logical levels of "1" and "0" prescribed for said actuation.

There will now be described by reference to FIGS. 2 and 3 the above-mentioned drawbacks accompanying the prior art oscillator. FIG. 2 presents a curve 201 showing the A.C. input-output characteristic of the oscillation inverter 101.

FIG. 3 sets forth curves 301, 302, 303 indicating the A.C. input-output characteristic of the amplification inverter 114.

In FIGS. 2 and 3, the abscissa shows the gate voltage $V_G(V)$ and the ordinate presents the drain voltage $V_D(V)$.

The reason why the oscillation inverter 101 and amplification inverter 114, though of the same arrangement, have different A.C. input-output characteristic is that the feedback circuit 111 connected as a load to the oscillation inverter 101 has a small input impedance, whereas the logical arithmetic operation circuit connected to the amplification inverter 114 generally has a prominently large impedance.

The oscillation inverter 101 having the A.C. input-output characteristic indicated by the curve of FIG. 2 has its operating point generally set at a point 202 at which said curve 201 makes the largest inclination, namely, an optimum operating point. When, therefore, the D.C. source 104 supplies voltage to the oscillator, then an oscillated output $V_1$ is produced at the output terminal 105 of the oscillation inverter 101. This oscillated output $V_1$ is conducted to the feedback circuit 111 formed of the condensers 109, 110 and quartz 108. Since the feedback circuit 111 has a smaller voltage gain than 1, a signal having a wave form indicated by $V_2$ is fed back to the output side of the feedback circuit 111 or the oscillation inverter 101. Oscillation is sustained under the above-mentioned condition. When fed back to the feedback circuit 111, the oscillated output signal $V_1$ which has a very small amplitude as seen from FIG. 2 is also supplied to the amplification inverter 114 and amplified to have a sufficient amplitude to actuate the logical arithmetic operation circuit. The logical arithmetic operation circuit connected as a load to the amplification inverter 114 has a very large impedance. Therefore, the A.C. input-output characteristic of the amplification inverter 114 is widely different, as seen from the curve 301 of FIG. 3, from the A.C. input-output characteristic (curve 201 of FIG. 2) of the oscillation inverter 101, to which there is connected as a load the feedback circuit 111 having an extremely small input impedance. The operating point of the amplification inverter 114 is biased by the D.C. bias voltage $V_b$ of an oscillated output signal from the oscillation inverter 101. Where the MOS FET's 112, 113 of the amplification inverter 114 have an equal threshold voltage to that of the MOS FET's 102, 103 of the oscillation inverter 101, then the operating point of the amplification inverter 114 is set at a point 304 coinciding with the optimum operating point 202 of the oscillation inverter 101. Therefore, the output terminal 116 of the amplification inverter 114 produces, as shown in FIG. 3, an output signal $V_3$ sufficiently amplified to have such amplitude as is capable of crossing both logical levels of "1" and "0" prescribed for actuation of the logical arithmetic operation circuit, upon receipt of an input signal, namely, an oscillated output signal $V_1$ from the oscillator inverter 101. Where the MOS FET 112 of the amplification inverter 114 and the MOS FET 102 of the oscillation inverter 101 have different threshold voltages, or the MOS FET 113 of the amplification inverter 114 and the MOS FET 103 of the oscillation inverter 101 have different threshold voltages, or all said MOS FET's have different threshold voltages, for example, where the MOS FET 113 acting as the driver of the amplification inverter 114 has a smaller or larger threshold voltage than the MOS FET 103 acting as the driver of the oscillation inverter 101, then the A.C. input and output characteristics of the amplification inverter 114 are shifted, as shown by the curves 302, 303 of FIG. 3, toward the left or right side of the A.C. input-output characteristic curve 301 accordingly. Therefore, the operating point of the curve 302 or 303 of the amplification inverter 114 is displaced from the optimum operating point to that indicated by 305 or 306, causing the output terminal 116 of the amplification inverter 114 to send forth a distorted output signal, as shown by $V'_3$ or $V''_3$ of FIG. 3, upon receipt of the oscillated output signal from the oscillation inverter 101, namely, an output signal lacking an amplitude capable of crossing both logical levels of "1" and "0" prescribed for actuation of the logical arithmetic operation circuit.

As previously mentioned, actuation of a logical arithmetic operation circuit, for example, an electronic computer requires clock pulses capable of reliably crossing both logical levels "1" and "0" prescribed for said actuation. Where, however, as described above, difference is originally present between the threshold voltages of the MOS FET's used as the drivers of the oscillation inverter 101 and amplification inverter 114, as well as between the threshold voltages of the MOS FET's used as the loads of the oscillation inverter 101 and amplification inverter 114 or between the threshold voltages of all said MOS FET's, then the prior art oscillator has the drawback that it gives off clock pulses lacking an amplitude capable of reliably crossing the logical levels of "1" and "0" prescribed for actuation of the logical arithmetic operation circuit.

For elimination of said drawback, it may be contemplated to use, for example, MOS FET's having exactly coinciding threshold voltages with those of the oscillation inverter 101 and amplification inverter 114 or as another means to supply the amplification inverter 114 with an output signal of sufficient amplitude from the oscillation inverter 101. Such procedure is supposed to produce an output signal having such amplitude as is capable of reliably crossing both logical levels "1" and "0" prescribed for actuation of the logical arithmetic operation circuit, even when the operating point of the amplification inverter 114 is somewhat displaced from an optimum point due to noncoincidence between the threshold voltages of the MOS FET's of the oscillation inverter 101 and amplification inverter 114.

However, an attempt to provide MOS FET's having an exactly equal threshold voltage would call for advanced manufacturing technology and prohibitively high cost for practical application. Moreover, even such advanced technology does not always enable all MOS FET's to have an accurately equal threshold voltage. Therefore, the above-mentioned attempt would unavoidably result in a low yield.

Further with the prior art clock pulse oscillator of FIG. 1, the oscillation inverter 101 could not, however tried, generate an oscillated output signal $V_1$ having a larger amplitude than made possible by the voltage $V_{DD}$ of the D.C. source 104. If, therefore, it is desired to provide an oscillated output signal $V_1$ having a sufficiently large amplitude, then it will be necessary to elevate the D.C. source voltage $V_{DD}$ itself. However, such attempt would inevitably raise problems with, for example, the withstand voltage of MOS FET's and power consumption, and also undesirably make it necessary to use an unduly large chip particularly for an integrated circuit.

As apparent from the foregoing description, the prior art oscillator using MOS FET's has proved unreliable as a generator of a signal of actuating a logical arithmetic operation circuit, for example, an electronic computer.

It is accordingly the object of this invention to provide an oscillator capable of generating an output signal having a desired amplitude, regardless of the displacement of the operating points of an oscillation inverter and amplification inverter due to the MOS FET's constituting both elements presenting different threshold voltages.

According to an aspect of this invention, there is provided an oscillator which comprises a phase-inverting amplifier formed of MOS FET's; a feedback circuit formed of a passive circuit and designed to invert the phase of the output signal from the phase-inverting amplifier, amplify said phase-inverted output signal with a larger voltage gain than 1 and feed the amplified output signal back to the input side of the phase-inverting amplifier; and a circuit for delivering the signal thus fed back by the feedback circuit to the succeeding amplifier without conducting said signal through the phase-inverting amplifier, thereby sending forth an output signal having such amplitude as is capable of reliably crossing the logical levels of "1" and "0" prescribed for actuation of a logical arithmetic operation circuit, for example, an electronic computer, even when the MOS FET's of the phase-inverting amplifier and the MOS FET's of the succeeding amplifier have different threshold voltages.

This invention can be more fully understood from the following detailed description when taken in conjunction with the accompanying drawings, in which:

FIG. 1 shows the arrangement of the prior art oscillator using MOS FET's;

FIG. 2 sets forth the A.C. input-output characteristic of an oscillation inverter included in the oscillator of FIG. 1;

FIG. 3 indicates the A.C. input-output characteristic of an amplification inverter included in the oscillator of FIG. 1;

Figure 4:
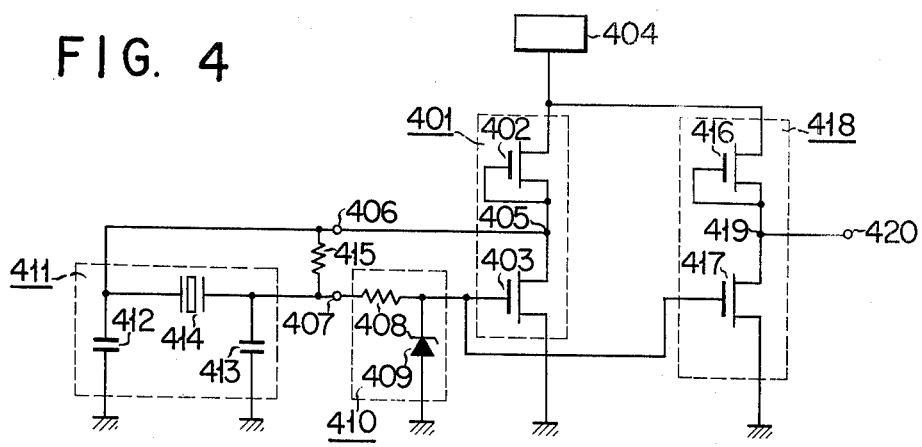
FIG. 4 illustrates the circuit arrangement of an oscillator according to an embodiment of this invention.
Figure 7:
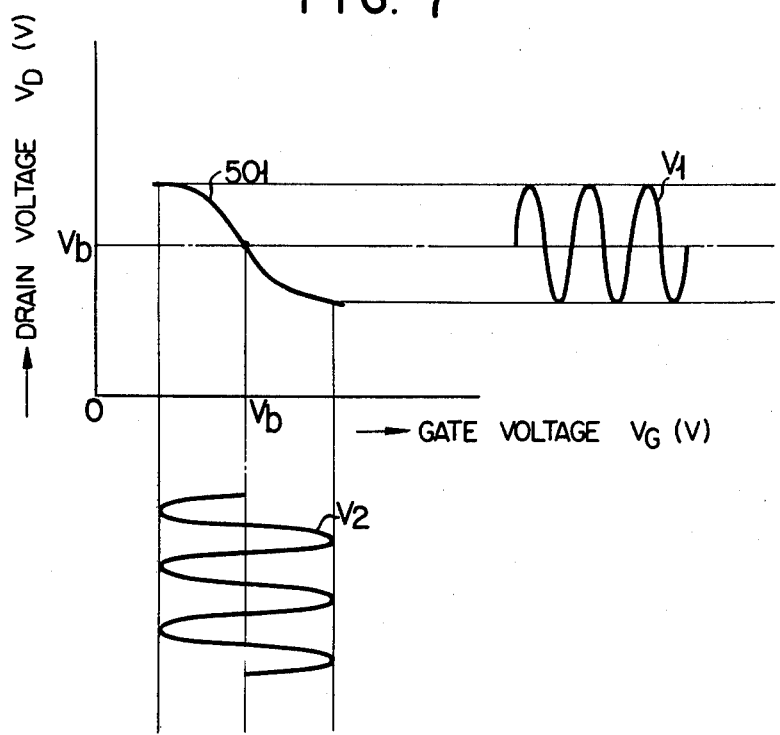
Figure 9:
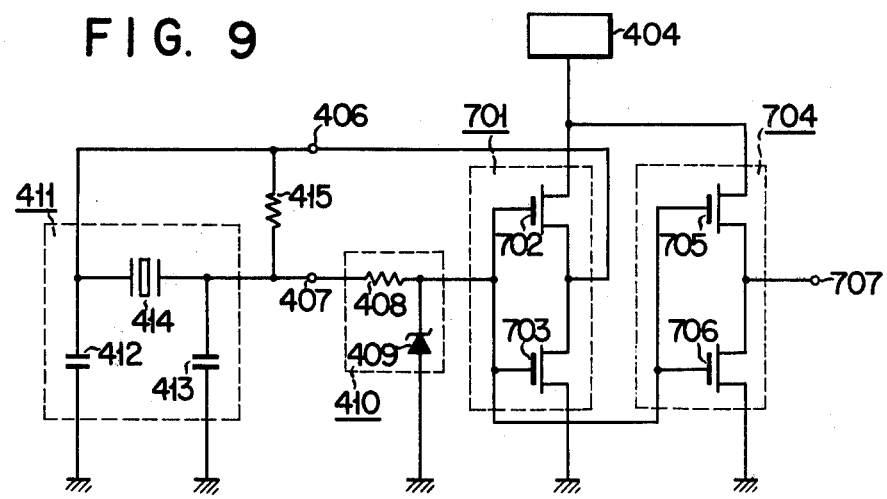
Figure 8:
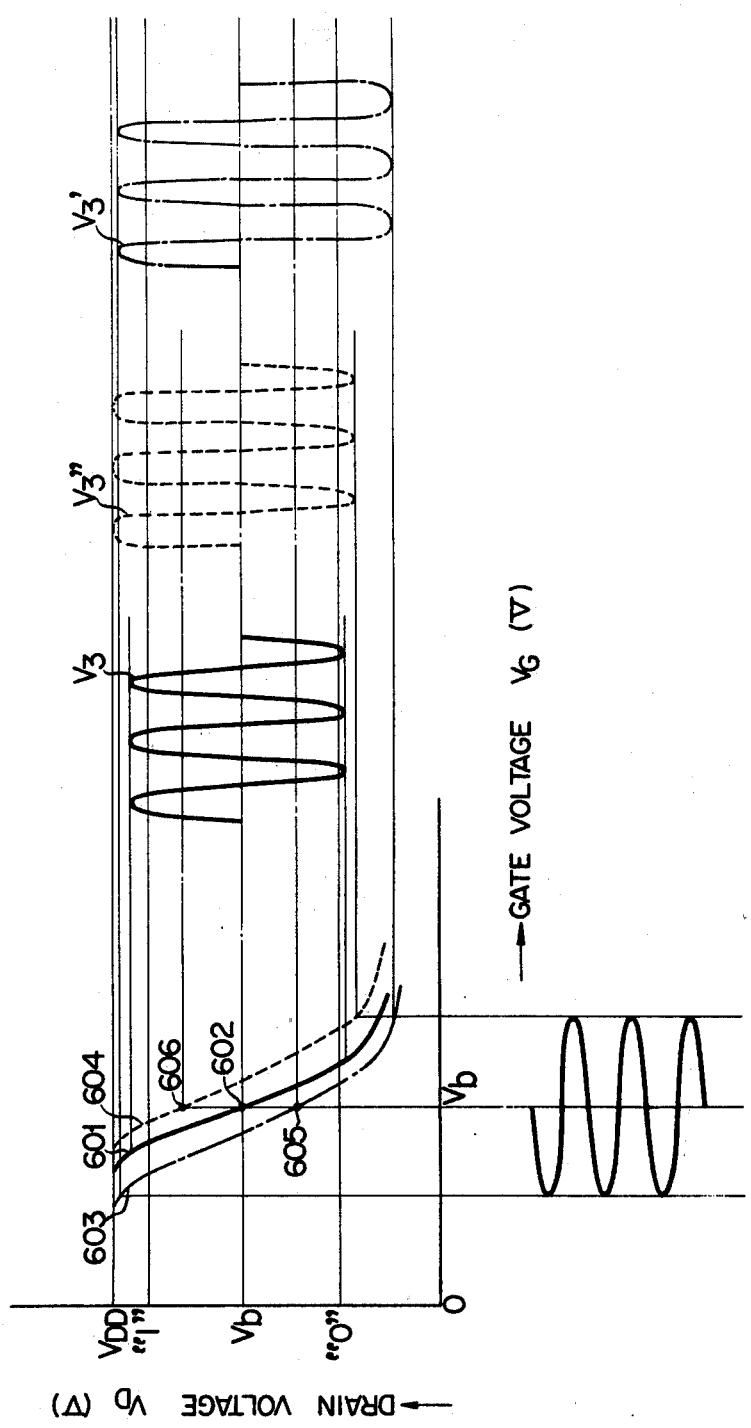
Figure 10:
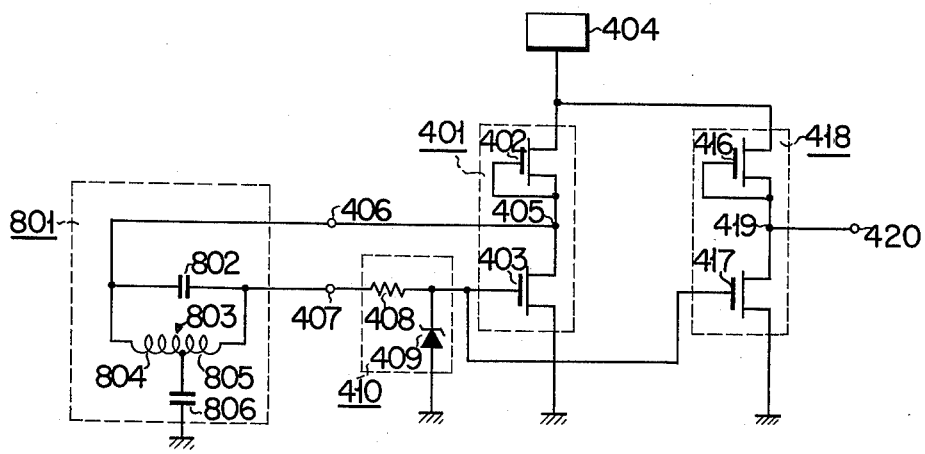
Figure 11:
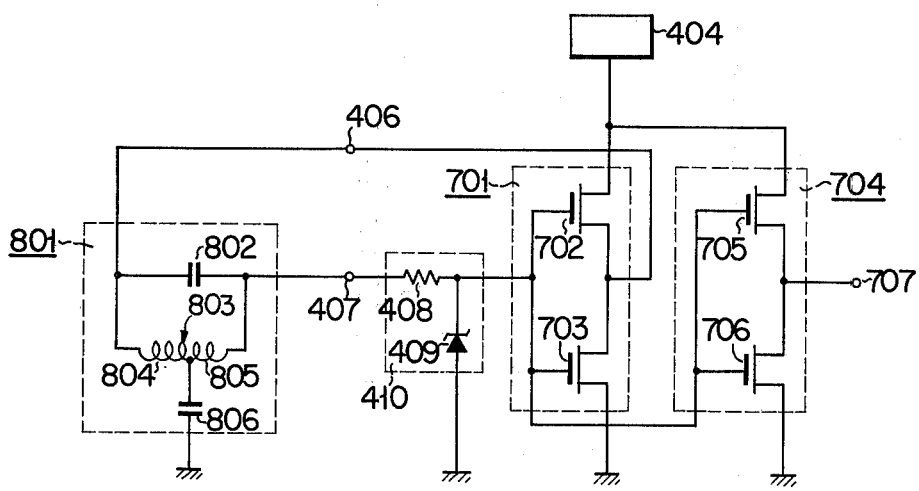

FIG. 7 presents the A.C. input-output characteristic of the oscillation inverter of the oscillator of FIG. 4;

FIG. 8 shows the A.C. input and output characteristics of the amplification inverter of the oscillator of FIG. 4;

FIG. 9 is a circuit diagram of an oscillator according to another embodiment of the invention;

FIG. 10 is a circuit diagram of an oscillator according to still another embodiment of the invention; and FIG. 11 is a circuit diagram of an oscillator according to a further embodiment of the invention.

There will now be described the preferred embodiments of this invention by reference to the appended drawings.

FIG. 4 sets forth the circuit arrangement of a Colpitts type oscillator according to an embodiment of this invention. With this embodiment, the MOS FET's constituting the oscillation inverter and amplification inverter are of the same channel type, that is, a P channel type. Referential numeral 401 denotes a phase-inverting amplifier or oscillation inverter formed of a P channel type MOS field effect transistor 402 (abbreviated as "MOS FET") acting as a load and a P channel type MOS FET 403 acting as a driver. The drain electrode of the MOS FET 402 is connected to a D.C. source 404 having a voltage $V_{DD}$. The gate electrode of said MOS FET 402 is connected to the source electrode thereof and also to the drain electrode of the MOS FET 403. The junction 405 of the gate electrode and the source electrode of the MOS FET 402 with the drain electrode of the MOS FET 403 serves as the output terminal of the oscillation inverter 401. The source electrode of the MOS FET 403 is grounded. A feedback circuit 411 is connected between the drain electrode and gate electrode of the MOS FET 403 through the terminal pins 406, 407 and a first high voltage breakdown-preventing circuit 410 formed of resistor 408 and regulating diode 409. One end of the resistor 408 included in said protective circuit 410 is connected to the terminal pin 407 and the other end of said resistor 408 is connected to the gate electrode of the MOS FET 403. The regulating diode 409 is connected between the gate and source electrodes of the MOS FET 403. The feedback circuit 411 comprises a condenser 412 with a capacitance $c_1$ connected through the terminal pin 406 between the drain and source electrodes of the MOS FET 403, a condenser 413 with a capacitance $c_2$ connected between the gate and source electrodes of the MOS FET 403 through the resistor 408 of the protective circuit 410 and the terminal pin 407, and a quartz crystal vibrator 414 (which is a piezoelectric element) with an inductance $l$ connected between the terminals 406, 407. Namely, the feedback circuit 411 concurrently constitutes the so-called resonance circuit having the inductance $l$ of the quartz crystal vibrator 414 and the capacitances $c_1$, $c_2$ of the condensers 412, 413. In this case, the capacitance $c_1$ of the condenser 412 should be made larger, as later described, than the capacitance $c_2$ of the condenser 413 in order to attain a larger voltage gain than 1.

A bias resistor 415 is connected between the terminal pins 406, 407. The drain electrode of the MOS FET 402 of the oscillation inverter 401 is connected to the drain electrode of the MOS FET 416 of the phase-inverting amplifier or amplification inverter 418 formed of the MOS FET 416 acting as a load and MOS FET 417 acting as a driver, said arrangement being same as in the oscillation inverter 401. The gate electrode of the MOS FET 403 of the oscillation inverter 401 is connected to the gate electrode of the MOS FET 417 of the amplification inverter 418. With the amplification inverter 418 arranged in the same manner as the oscillation inverter 401, the source electrode of the MOS FET 416 of said amplification inverter 418 is connected to the drain electrode of the MOS FET 417, and the gate electrode is connected to its own source electrode. The source electrode of the MOS FET 417 is grounded. The junction 419 of the gate and source electrodes of the MOS FET 416 with the drain electrode of the MOS FET 417 is connected to the output terminal 420 of the subject oscillator of FIG. 4.

Figure 1:
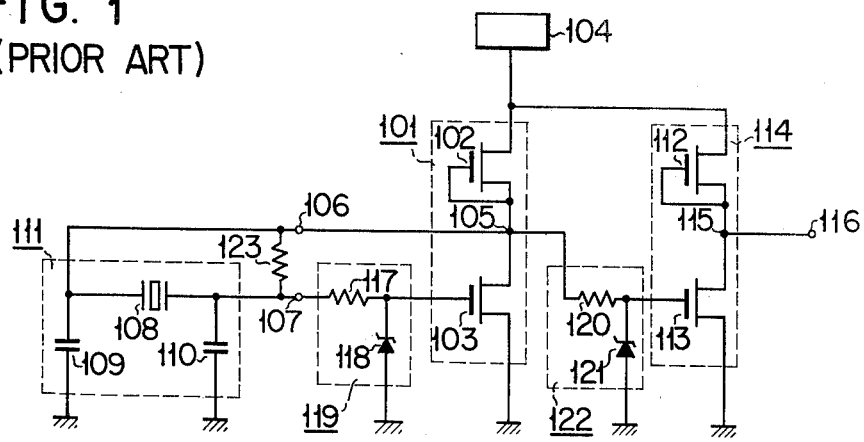
Figure 2:
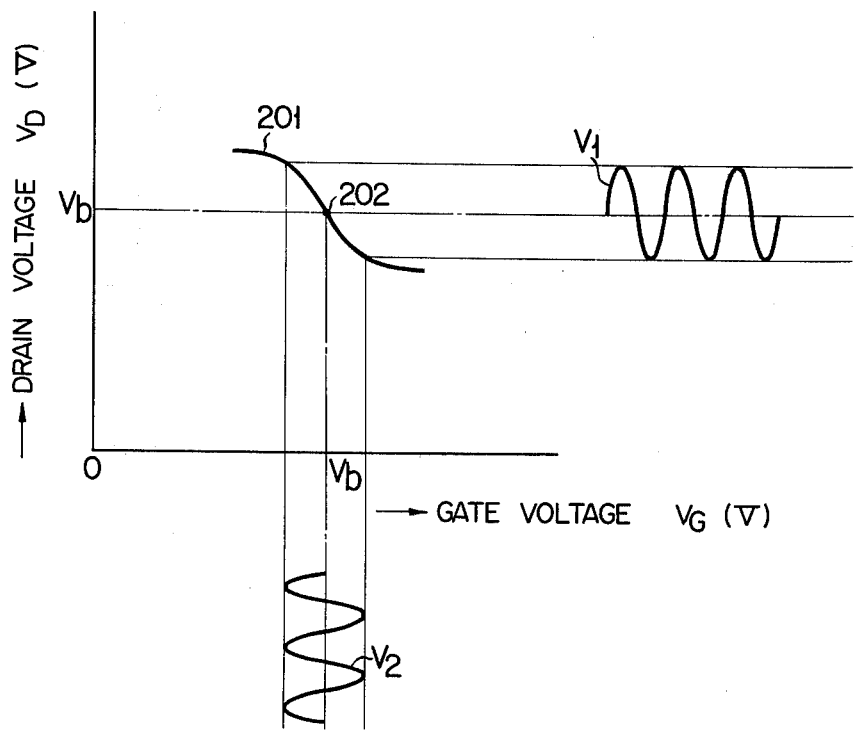
Figure 3:
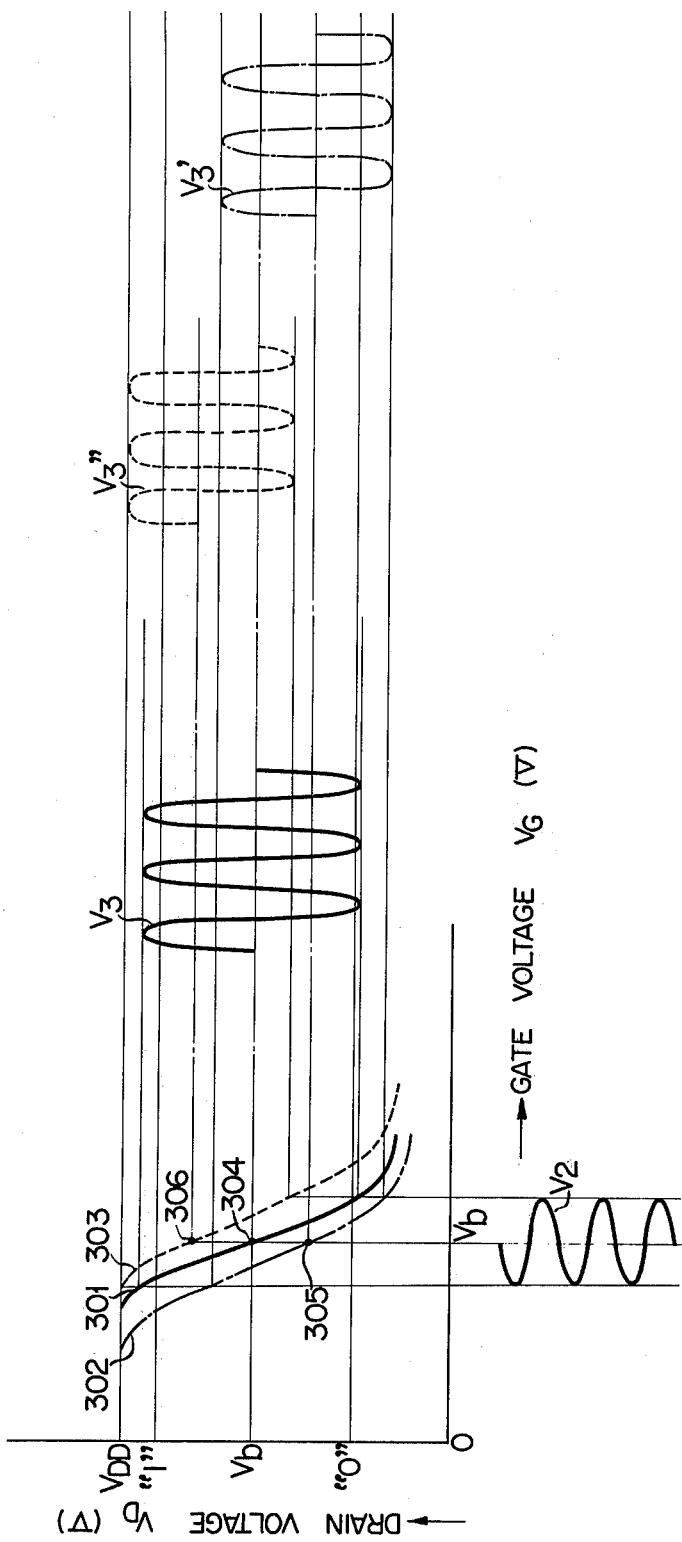

The fundamental difference between the prior art oscillator of FIG. 1 and the oscillator of this invention shown in FIG. 4 is that an oscillated output signal is drawn out at different points between the oscillator of the invention and that of the prior art, and the magnitude relationship of the capacitances of two condensers included in the feedback circuit of the invention is reversed from that of the prior art due to said oscillated output signal being drawn out at different points.

With the prior art oscillator of FIG. 1, an input signal to the amplification inverter 114 is drawn out from the input side of the feedback circuit 111. Consequently, the capacitance $c_1$ of the condenser 109 included in the feedback circuit 111 is chosen to be smaller than the capacitance $c_2$ of the condenser 110 thereof in order that an input signal to the feedback circuit 111, namely, an output signal $V_1$ from the oscillation inverter 101 may have a larger amplitude than an output signal from the feedback circuit 111, namely, an input signal $V_2$ to the oscillation inverter 101. In contrast, with the embodiment of this invention shown in FIG. 4, an input signal to the amplification inverter 418 is drawn out from the output side of the feedback circuit 411. Consequently, the capacitance $c_1$ of the condenser 412 included in the feedback circuit 411 is chosen to be larger than the capacitance $c_2$ of the condenser 413 thereof in order that an input signal $V_1$ to the feedback circuit 411 may have a smaller amplitude than an output signal $V_2$ from said feedback circuit 411.

There will now be further detailed the above-mentioned arrangement of the oscillator of this invention shown in FIG. 4. The oscillation inverter 401 and feedback circuit 411 may be represented by the equivalent circuit of FIG. 5. The oscillation inverter 401 is represented by a series circuit including the MOS FET 403 acting as a voltage source $-gmRl$ and the MOS FET 402 acting as a resistor $Rl$. The feedback circuit 411 connected to the oscillation inverter 401 is denoted by a series circuit consisting of an inductor L and a resistor $r$ represented by the quartz crystal vibrator 414, a condenser C1 represented by the condenser 412 and condenser C2 represented by the condenser 413. Namely, the feedback circuit 411 constitutes the so-called resonance circuit. An output signal from the feedback circuit 411 is fed back to the voltage source $-gmRl$ and also conducted to the succeeding amplification inverter 418.

It is known that the requisite conditions for the oscillation of the above-mentioned oscillator are satisfied when the feedback circuit is so arranged as to produce an output signal $V_2$ whose phase is inverted from an input signal $V_1$, namely, to carry out a positive feedback and a larger loop gain than 1 is attained.

Figure 5:
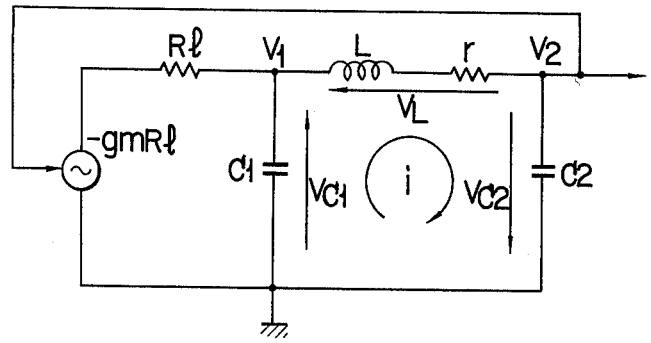
FIG. 5 is an equivalent circuit diagram of the amplification inverter and feedback circuit of the oscillator of FIG. 4.
Figure 6:
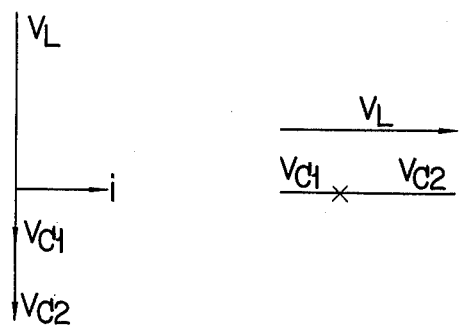
FIG. 6 is a vectorial chart of the voltage and current of the equivalent circuit of FIG. 5.

Now let it be assumed that with the equivalent circuit of FIG. 5, resonance current passing through the resonance circuit is indicated by $i$ and the resistance $r$ of the quartz crystal vibrator 414 is negligibly small, namely, Q of the inductor L ($Q = j\omega l/r$) is extremely large (in the case of a quartz, Q is generally taken to be 10,000 to 100,000). Then the relationship between the voltage $V_L$ across the series circuit formed of the inductor L and resistor $r$, voltage $V_{C1}$ across the condenser C1, voltage $V_{C2}$ across the condenser C2 and resonance current $i$ may be presented by the vectorial chart of FIG. 6(a). FIG. 6(b) shows that the voltage $V_L$ is vectorially equal to a sum of the voltages $V_{C1}$ and $V_{C2}$.

When the resonance circuit carries on resonance, there results, as is well known, the following equation $$V_L = V_{C1} + V_{C2}$$

$V_{C1}$ and $V_{C2}$ may eventually be expressed as $$V_{C1} = (c_2/c_1 + c_2) V_L = V_1$$

$$V_{C2} = (c_2/c_1 + c_2) V_L = V_2$$

With the foregoing embodiment of this invention, the capacitance $c_1$ of the condenser 412 (the capacitance $c_1$ of the condenser C1 of the equivalent circuit of FIG. 5) is chosen, as previously described, to be larger than the capacitance $c_2$ of the condenser 413 (the capacitance $c_2$ of the condenser C2 of the equivalent circuit of FIG. 5). As seen from the above equations, therefore, an output signal $V_2$ from said feedback cricuit 411 can have a larger amplitude than an input signal $V_1$ thereto. This output signal $V_2$ having such large amplitude is delivered to the succeeding amplification inverter 418.

There will now be described by reference to FIGS. 7 and 8 the operation of the oscillator of this invention.

Like the oscillation inverter 101 included in the prior art oscillator of FIG. 1, the oscillation inverter 401 included in the oscillator of this invention shown in FIG. 4 has D.C. input and output characteristics indicated by the curve 501 of FIG. 7. Where the D.C. source 404 impresses voltage $V_{DD}$ across the drain electrode of the MOS FET 402 and source electrode of the MOS FET 403 both included in the oscillation inverter 401 so as to cause the drain electrode of the MOS FET 402 to have a positive potential, then the MOS FET's 407, 403 are actuated, causing the drain electrode of the MOS FET 403 to give off an oscillated output signal indicated by $V_1$. This oscillated output signal $V_1$ is carried to the feedback circuit 411 formed of the condensers 412, 413 and quartz crystal vibrator 414. While the feedback circuit 411 is carrying on resonance, an output signal from said circuit 411 has its phase inverted from an input signal thereto, or an output signal $V_1$ from the oscillation inverter 401. Further, said output signal from the feedback circuit 411 is amplified with a larger voltage gain than 1, because the capacitance $c_1$ of the condenser 412 is chosen to be larger than the capacitance $c_2$ of the condenser 413. The output signal from the feedback circuit 411, namely, an input signal $V_2$ to the oscillation inverter 401 is supplied to the input section of the oscillation inverter 401, namely, the gate electrode of the MOS FET 403 through the resistor 408 of the aforesaid protective circuit 410. The above-mentioned operation sustains oscillation. The output signal $V_2$ from the feedback circuit 411 is delivered to the gate electrode of the MOS FET 403 and also to the input section of the amplification inverter 418, namely, the gate electrode of the MOS FET 417. Where, in this case, the MOS FET's of the amplification inverter 418 have an equal threshold voltage to that of the MOS FET's of the oscillation inverter 401, then said amplification inverter 418 presents the A.C. input and output characteristic shown by the referential numeral 601 in FIG. 8. The operating point of the amplification inverter 418 having said characteristic 601 is positioned at an optimum point 602. Therefore, the output terminal 420 of the oscillator of FIG. 4 sends forth an output signal having a sufficiently large amplitude to cross both logical levels "1" and "0". Where the MOS FET's of the amplification inverter 418 have different threshold voltages from the MOS FET's of the oscillation inverter 401, namely, the A.C. input and output characteristic of the amplification inverter 418 is displaced from the A.C. input and output characteristic 601 to the left or right as shown by the referential numeral 603 or 604, then the operating point of the amplification inverter 418 is shifted from the optimum operating point 602 to a point 605 or 606. Since, even under such condition, an input signal to the amplification inverter 418, namely, an output signal $V_2$ from the feedback circuit 411 has a fully large amplitude, the output terminal 420 of the oscillator of FIG. 4 generates an output signal $V'_3$ or $V''_3$ having such amplitude as is capable of reliably cross both logical levels "1" and "0".

With the foregoing embodiment, the oscillation inverter 401 and amplification inverter 418 were formed of P channel type MOS FET's. If the P channel type is replaced by the N channel type, the same effect can obviously be attained.

There will now be described by reference to FIG. 9 another embodiment of this invention formed of a Colpitts type oscillator. The arrangement of FIG. 9 is substantially the same as that of FIG. 4, excepting that the oscillation inverter 401 and amplification inverter 418 are formed of complementary MOS FET's. The parts of FIG. 9 the same as those of FIG. 4 are denoted by the same numerals, description thereof being omitted. Detailed description is only given of the different parts of FIG. 9 from FIG. 4. An oscillation inverter 701 is formed of a P channel type MOS FET 702 acting as a load and an N channel type MOS FET 703 acting as a driver. An amplification inverter 704 is formed of a P channel type MOS FET 705 acting as a load and an N channel type MOS FET 706 acting as a driver. Since both oscillation inverter 701 and amplification inverter 704 are of the same arrangement, description is only given of the oscillation inverter 701. The gate electrode of the P channel type MOS FET 702 is connected to the gate electrode of the N channel type MOS FET 703. The source electrode of the P channel type MOS FET 702 is connected to the drain electrode of the N channel type MOS FET 703. The source electrode of the N channel type MOS FET 703 is grounded.

The gate electrodes of the MOS FET's 702, 703 of the oscillation inverter 701 arranged as described above are connected to the terminal pin 407 through the resistor 408 of the protective circuit 410, as in the embodiment of FIG. 4. The source electrode of the MOS FET 702 and the drain electrode of the MOS FET 703 are connected to the terminal pin 406. Further as in FIG. 4, the bias resistor 415 and feedback circuit 411 are connected between the terminal pins 406, 407, so as to constitute an external circuit. The drain electrode of the MOS FET 702 is connected to the D.C. source 404 and also to the drain electrode of the P channel type MOS FET 705 of the amplification inverter 704. The gate electrode of the MOS FET's 702, 703 are connected to the gate electrodes of the MOS FET's 706, 707 of the amplification inverter 704. The source electrode of the MOS FET 705 and the drain electrode of the MOS FET 706 are connected to the output terminal 707 of the amplification inverter 704.

With the oscillator of FIG. 9 arranged as described above, the input section of the amplification inverter 704, namely, the gate electrodes of the MOS FET's 705, 706 are supplied with an output signal from the feedback circuit 411.

Since the oscillator of FIG. 9 is operated in the same manner as that of FIG. 4, detailed description of said operation is omitted. In the case of FIG. 9, the condenser 412 has a larger capacitance $c_1$ than the capacitance $c_2$ of the condenser 413. Accordingly, the feedback circuit 411 has a larger voltage gain than 1, causing an output signal $V_2$ therefrom to have a larger amplitude than an input signal $V_1$ thereto. Even where, therefore, the MOS FET 702 of the oscillation inverter 701 has a different threshold voltage from the MOS FET 705 of the amplification inverter 704, or the MOS FET 703 of the oscillation inverter 701 has a different threshold voltage from the MOS FET 706 of the amplification inverter 704, or all said MOS FET's have different threshold voltages, the output terminal 707 of the amplification inverter 704 produces an output signal having a prescribed amplitude.

With the second embodiment of FIG. 9, the oscillation inverter and amplification inverter were each formed of a P channel type MOS FET acting as a load and an N channel type MOS FET acting as a driver. If this arrangement is reversed, the same effect can obviously be attained.

A quartz crystal vibrator 414 was used in the embodiments of FIGS. 4 and 9. However, said quartz crystal vibrator may be replaced by any other type, for example, the ordinary coil, or any other piezoelectric element such as a ceramic resonator which has an inductance impedance at the oscillation frequency.

There will now be described by reference to FIG. 10 a third embodiment of this invention formed of a Hartley type oscillator. FIG. 10 has substantially the same arrangement as FIG. 4, excepting that the feedback circuit 801 of FIG. 10 has a different arrangement from FIG. 4. Therefore, the parts of FIG. 10 the same as those of FIG. 4 are denoted by the same numerals, description thereof being omitted. Detailed description is only given of the different parts of FIG. 10 from FIG. 4. The feedback circuit 801 is connected between the terminal pins 406, 407. This feedback circuit 801 comprises a parallel circuit consisting of a condenser 802 and an inductor 803 with an inductance $l$ and a condenser 806, one end of which is grounded and the other end of which is connected to the intermediate part of said inductor 803 so as to divide it into an inductor unit 804 with an inductance $l_1$ and an inductor unit 805 with an inductance $l_2$.

In this case, the inductance $l_1$ is chosen to be smaller than the inductance $l_2$.

While the oscillator of FIG. 10 is carrying on oscillation, the feedback circuit 801 is under a resonating condition. With the voltage impressed across the condenser 802 represented by VC and the voltages impressed across the condensers 804, 805 denoted by $V_{L1}$, $V_{L2}$ respectively, then the following equations result:

$$V_{L1} = (l_1/l_1 + l_2) VC = V_2$$

$$V_{L2} = (l_2/l_1 + l_2) VC = V_1$$

The inductance $l_1$ is chosen, as previously mentioned, to be smaller than the inductance $l_2$. As apparent from the above equations, therefore, an input signal $V_1$ to the feedback circuit 801 has a smaller amplitude than an output signal $V_2$ therefrom, causing the amplification inverter 418 to be supplied with an output signal $V_2$ from the feedback circuit 801 having a fully large amplitude. Like the preceding embodiments of FIGS. 4 and 9, that of FIG. 10 enables the output terminal 420 of the amplification inverter 418 to send forth an output signal having a sufficiently large amplitude to cross both logical levels "1" and "0" prescribed for actuation of a logical arithmetic operation circuit, even where the MOS FET 416 of the amplification inverter 418 and the MOS FET 402 of the oscillation inverter 410 have different threshold voltages, or the MOS FET 417 of the amplification inverter 418 and the MOS FET 403 of the oscillation inverter 401 have different threshold voltages, or all said MOS FET's have different threshold voltages.

There will now be described by reference to FIG. 11 a fourth embodiment of this invention. This embodiment consists of a Hartley type oscillator comprising an oscillation inverter and amplification inverter using complementary MOS FET's. The oscillation inverter and amplification inverter of FIG. 11 are of the same arrangement as the oscillation inverter 701 and amplification inverter 704 of FIG. 9 and the feedback circuit of FIG. 11 is of the same arrangement of the feedback circuit 801 of FIG. 10. The same parts of FIG. 11 as those of FIGS. 9 and 10 are denoted by the same numerals, description thereof being omitted. The fourth embodiment of FIG. 11 consisting of the Hartley type oscillation can obviously realize the same effect.

With the foregoing embodiments, the feedback circuit was formed of the resonance circuit indicated by the referential numeral 411 in FIGS. 4 and 9 or the resonance circuit denoted by the referential numeral 801 in FIGS. 10 and 11. However, the feedback circuit is not limited to such types, but may be formed of any other type, such as the ordinary stepup transformer or recently developed surface acoustic wave device.

As mentioned above, the feedback circuit of the oscillator of this invention using MOS FET's is formed of a passive circuit and so designed as to invert the phase of an output signal from the oscillation inverter, amplify said phase-inverted output with a larger voltage gain than 1 and feed the amplified output signal back to the input side of the phase-inverting oscillation inverter. And the amplified output signal from the feedback circuit is delivered to the succeeding amplification inverter without conducting said signal through the phase-inverting oscillation inverter. Therefore, the oscillator of this invention has the following advantages that the amplification inverter is supplied with an output signal having a fully large amplitude from the feedback circuit, enabling an output signal having a prescribed amplitude for actuation of a logical arithmetic operation circuit to be sent forth from the output terminal of said amplification inverter.

Therefore, the oscillator of this invention is prominently reliable as an oscillator of a signal required for actuation of a logical arithmetic operation circuit.

The prior art oscillator which should be provided with MOS FET's having the same property required highly advanced manufacturing technology, unavoidably resulting in a low yield. In contrast, the oscillator of this invention can have the irregular property of MOS FET's compensated, offering great advantages from the standpoint of manufacturing technology and production cost.

Further with the prior art oscillator, the amplification inverter was supplied with an output signal from the oscillation inverter, namely, an input signal to the feedback circuit. Therefore, the feedback circuit was so arranged as to restrict a loop gain in the oscillator. In contrast, the oscillator of this invention is so designed as to cause the amplification inverter to be supplied with an output signal from the feedback circuit. Therefore, the feedback circuit of the invention is so arranged as to conversely increase a loop gain in the oscillator, offering the advantage of more decreasing the area of a chip required for integration of an oscillator and more facilitating the design of the circuit arrangement thereof than in the prior art oscillator.

For an integrated circuit of an oscillator using MOS FET's, it is necessary to provide a protective circuit formed, as previously mentioned, of a resistor and regulate diode for MOS FET's brought into direct contact with the terminal pins in order to product the breakdown of said MOS FET's due to high voltage being impressed thereon by the inadvertent touch of a human body with the terminal pins. With the prior art oscillator, a protective circuit must be provided not only for the MOS FET 103 acting as the driver of the oscillation inverter 101, but also for the MOS FET 113 fitted to the terminal pin as the driver of the amplification inverter 114 to draw out an input signal to the amplification inverter 114 from the input side of the feedback circuit 111, namely, from the drain electrode of the MOS FET 103 acting as the driver of the oscillation inverter 101. In contrast, with the oscillator of this invention, an input signal to the amplification inverter is drawn out from the output side of the feedback circuit, namely, from the gate electrode of the MOS FET acting as the driver of the oscillation inverter. Therefore, it is only necessary to provide a protective circuit for the MOS FET acting as the driver of the oscillation inverter, offering the advantage of facilitating the design of an oscillator.

What we claim is:

1. An oscillator comprising a first inverter formed of insulated gate field effect transistors and acting as an oscillator; a feedback circuit formed of a passive circuit and designed to invert the phase of an output signal from the first inverter, amplify the output signal with a larger voltage gain than 1 and feed the output signal back to the input side of the first inverter; and means for drawing out the output signal of the feedback circuit from the input side of the first inverter and delivering said output signal to a succeeding second inverter acting as an amplifier.

2. The oscillator according to claim 1, wherein the feedback circuit is constituted by a resonance circuit formed of first and second capacitance elements and an inductance element connected in the $\pi$ form; and the first capacitance element connected to the output terminal of the first inverter has a larger capacity than the second capacitance element connected to the input terminal of the first inverter.

3. The oscillator according to claim 2, wherein the inductance element is a piezoelectric element.

4. The oscillator according to claim 3, wherein the piezoelectric element is formed of a quartz crystal vibrator.

5. The oscillator according to claim 1, wherein the second inverter has the same arrangement as the first inverter.

6. The oscillator according to claim 5, wherein the field effect transistor acting as the load of the first and second inverters is of the same channel type as the field effect transistor acting as the driver of said both inverters.

7. The oscillator according to claim 5, wherein the field effect transistor acting as the load of the first and second inverters is complementary to the field effect transistor acting as the driver of said both inverters.

8. The oscillator according to claim 1, wherein the feedback circuit consists of a bridged T-type circuit comprising first and second series-connected inductance elements, a first capacitance element parallel connected to said series-connected inductance elements and a second capacitance element connected between the junction of the first inductance element with the second inductance element and the ground; and the second inductance element connected to the input terminal of the oscillation inverter has a larger inductance than the first inductance element connected to the output terminal of the oscillation inverter.

9. The oscillator according to claim 8, wherein the amplifier is a phase-inverting amplification inverter having the same arrangement as the oscillation inverter.

10. The oscillator according to claim 9, wherein the field effect transistor acting as the load of the phase-inverting oscillation inverter and phase-inverting amplification inverter is of the same channel type as the field effect transistor acting as the driver of said both inverters.

11. The oscillator according to claim 9, wherein the field effect transistor acting as the load of the phase-inverting oscillation inverter and phase-inverting amplification inverter is complementary to the field effect transistor acting as the driver of said both inverters.

12. An oscillator which is of the Colpitts type and comprises a first inverter formed of insulated gate field effect transistors and acting as an oscillator; a feedback circuit formed of a passive circuit and designed to invert the phase of an output signal from the first inverter, amplify said phase-inverted output signal with a larger voltage gain than 1 and feed the amplified output signal back to the input side of the first inverter; and means for drawing out the output signal of the feedback circuit from the input side of the first inverter and delivering said output signal to a succeeding second inverter acting as an amplifier.

13. An oscillator which is of the Hartley type and comprises a phase-inverting oscillation inverter formed of insulated gate field effect transistors; a feedback circuit formed of a passive circuit and designed to invert the phase of an output signal from the phase-inverting oscillation inverter, amplify said phase-inverted output signal with a larger voltage gain than 1 and feed the amplified output signal back to the input side of the phase-inverting oscillation inverter; and means for drawing out the output signal of the feedback circuit from the input side of the oscillation inverter and delivering said output signal to the succeeding amplifier.

* * * * *